United States Patent
Tomita et al.

(10) Patent No.: US 7,727,871 B2
(45) Date of Patent: Jun. 1, 2010

(54) MANUFACTURING METHOD OF SEMICONDUCTOR DEVICE USING ETCHING SOLUTION

(75) Inventors: Hiroshi Tomita, Yokohama (JP); Hiroyasu Iimori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 503 days.

(21) Appl. No.: 11/702,575

(22) Filed: Feb. 6, 2007

(65) Prior Publication Data
US 2007/0224792 A1 Sep. 27, 2007

(30) Foreign Application Priority Data
Feb. 7, 2006 (JP) ............... 2006-029639

(51) Int. Cl.
*H01L 21/3205* (2006.01)
*H01L 21/4763* (2006.01)

(52) U.S. Cl. .............. 438/594; 257/E21.251; 252/79.3

(58) Field of Classification Search ............ 438/594; 257/E21.251
See application file for complete search history.

(56) References Cited

U.S. PATENT DOCUMENTS

| 6,645,876 B2 | 11/2003 | Saito et al. |
| 2005/0230045 A1 | 10/2005 | Okuchi et al. |
| 2006/0014391 A1* | 1/2006 | Lee et al. .......... 438/695 |

OTHER PUBLICATIONS

Meuris et al. "Implementation of the IMEC-Clean in advanced CMOS manufacturing", IEEE, 1999 pp. 157-160.*

* cited by examiner

*Primary Examiner*—W. David Coleman
*Assistant Examiner*—Sonya D McCall-Shepard
(74) *Attorney, Agent, or Firm*—Finnegan, Henderson, Farabow, Garrett & Dunner, L.L.P.

(57) ABSTRACT

This disclosure concerns a manufacturing method of a semiconductor device comprising an etching process using an etching solution having ozone dissolved by 10 ppm or more into a liquid containing $H_2SO_4$ by 86 wt % to 97.9 wt %, HF by 0.1 wt % to 10 wt %, and $H_2O$ by 2 wt % to 4 wt %.

9 Claims, 4 Drawing Sheets

MANUFACTURING METHOD OF SEMICONDUCTOR DEVICE USING ETCHING SOLUTION

CROSS-REFERENCE TO RELATED APPLICATION

This application is based upon and claims the benefit of priority from the prior Japanese Patent Applications No. 2006-29639, filed on Feb. 7, 2006 the entire contents of which are incorporated herein by reference.

BACKGROUND OF THE INVENTION

1. Field of the Invention

The present invention relates to a manufacturing method of a semiconductor device and an etching solution.

2. Related Art

At the time of etching silicon or polysilicon in an RIE (Reactive Ion Etching) process, a mixed gas of a halogen gas (Br gas and a Cl gas, for example) and oxygen is used as an etching gas. In this case, a $SiO_2$ deposit is formed.

At the time of etching a silicon oxide film or a silicon nitride film in the RIE process, a CF (fluorocarbon) gas is used as an etching gas. In this case, a CF deposit is formed.

Therefore, when a lamination film of a polysilicon film and a silicon nitride film is continuously etched by RIE, both a $SiO_2$ deposit and a CF deposit are adhered to the etched result as etching residues. After this RIE, it is necessary to continuously execute a remove processing of the $SiO_2$ deposit and a remove processing of the CF deposit. For example, it is necessary to carry out a process as a combination of an oxidation process of the CF deposit by means of a dry ashing, an SPM (sulfuric acid and hydrogen peroxide mixture) process, an alkali process, a DHF (diluted hydrofluoric acid) process, a VPC (vapor HF) process, and the like. When these processes are combined, the number of steps of processes after the RIE increases. Further, the DHF process etches a gate insulation film and a silicon oxide film of STI (Shallow Trench Isolation) and the like. Therefore, the use of the DHF process after forming the STI and the gate insulation film is not preferable.

SUMMARY OF THE INVENTION

A manufacturing method of a semiconductor device according to an embodiment of the present invention comprises an etching process using an etching solution having ozone dissolved by 10 ppm or more into a liquid containing $H_2SO_4$ by 86 wt % to 97.9 wt %, HF by 0.1 wt % to 10 wt %, and $H_2O$ by 2 wt % to 4 wt %.

A etching solution used in a manufacturing method of a semiconductor device according to an embodiment of the present invention, the etching solution comprises ozone dissolved by 10 ppm or more into a liquid containing $H_2SO_4$ by 86 wt % to 97.9 wt %, HF by 0.1 wt % to 10 wt %, and $H_2O$ by 2 wt % to 4 wt %.

DETAILED DESCRIPTION OF THE INVENTION

Embodiments of the present invention will be explained below with reference to the accompanying drawings. The present invention is not limited to the embodiments.

Figure 1:
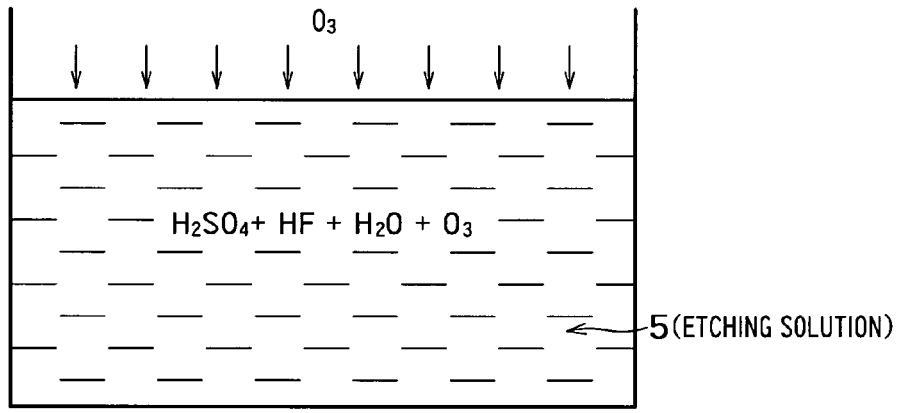
FIG. 1 is a schematic diagram showing an etching solution 5 used in the etching process according to an embodiment of the present invention.

FIG. 1 is a schematic diagram showing an etching solution 5 used in the etching process according to an embodiment of the present invention. The etching solution 5 is a liquid having ozone ($O_3$) equal to or more than 10 ppm dissolved in a liquid containing sulfuric acid ($H_2SO_4$) of 86 wt % to 97.9 wt %, hydrofluoric acid (HF) of 0.1 wt % to 10 wt %, and water ($H_2O$) of 2 wt % to 4 wt %. This liquid is hereinafter also called SFOM. The above wt % means weight percent. The total weight percent of $H_2SO_4$, HF and $H_2O$ is 100 wt %.

An etching solution (SFM) containing sulfuric acid and hydrofluoric acid as main components and water of 2 wt % to 4 wt % can etch the $SiO_2$ deposit at a high selection rate (100 to 300 or more) to a thermal oxide film. The $SiO_2$ deposits include SiOx, SiOxBry, SiOxFy, SiOxCy, SiOxBryCz, and SiOxBryCzFα (where x, y, z, and α are positive numbers). On the other hand, when an etching solution having a relatively high water content rate is used, a selection rate (a selectivity) of the $SiO_2$ deposit to the thermal oxide film becomes 100 or smaller. In other words, when the water content rate is set as low as 2 wt % to 4 wt %, the etching solution according to the present embodiment can selectively remove the $SiO_2$ deposit at a high selection rate.

In general, commercially available sulfuric acid contains $H_2SO_4$ of 96 wt % to 98 wt %, and $H_2O$ of 2 wt % to 4 wt %. Therefore, when commercially available anhydrofluoric acid is mixed into commercially available sulfuric acid, this etching solution can be prepared easily.

In the present embodiment, ozone is further dissolved by 10 ppm or more into this etching solution, thereby generating the etching solution 5. Because ozone is strongly oxidative, ozone can oxidize the CF deposit, and the hydrofluoric acid etches the oxidized CF deposit. CF deposits are CxFy and CxFyOz, for example (where x and y are positive numbers). In order to effectively oxidize the CF deposit, it is preferable to dissolve ozone into the etching solution by 10 ppm or more. Unlike ozone concentration in pure water, the ozone concentration in sulfuric acid has high saturation solubility. Therefore, ozone can be dissolve by about 10 ppm in a high temperature state of 150° C. At a lower temperature than this, solubility increases, and dissolved ozone concentration inevitably becomes high.

Figure 2:
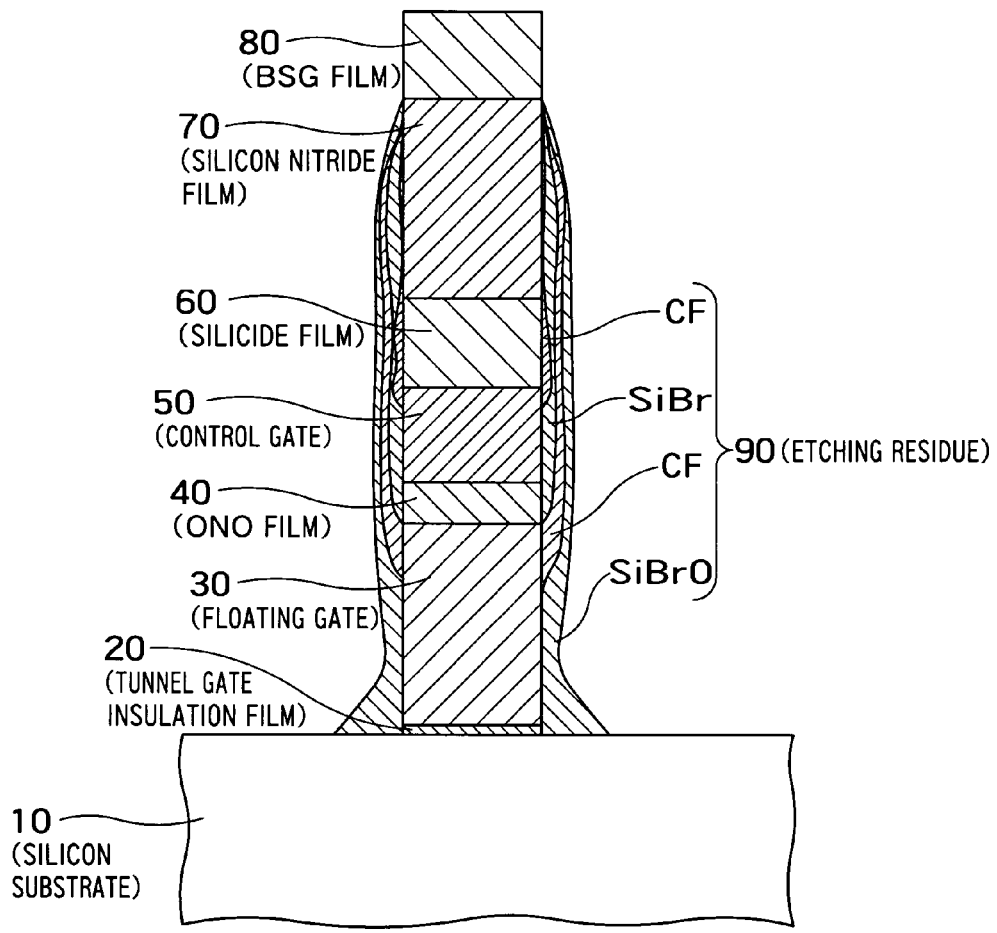
FIG. 2 is a cross-sectional diagram showing a gate structure after etching a lamination film below a BSG film 80 by RIE using the BSG film 80 as a hard mask.

FIG. 2 is a cross-sectional diagram showing a gate structure after etching a lamination film below a BSG film 80 by RIE using the BSG film 80 as a hard mask. The structure shown in FIG. 2 is formed as follows. First, a tunnel gate insulation film 20 is formed on a silicon substrate 10. The tunnel gate insulation film 20 is a silicon oxide film, for example. A material of a floating gate 30 is deposited on the tunnel gate insulation film 20. The floating gate 30 is composed of polysilicon, for example. An ONO film 40 is deposited on the material of the floating gate 30. The ONO film 40 is a lamination film of a silicon oxide film, a silicon nitride film and a silicon oxide film ($SiO_2$—SiN—$SiO_2$), or a silicon oxynitride (SiON) film. A material of a control gate 50 is deposited on the ONO film 40. The material of a control gate 50 is composed of polysilicon, for example. A silicide film 60 is formed on the material of the control gate 50. The silicide film 60 can be any one of metal silicides including titanium silicide (TiSi), nickel silicide (NiSi), cobalt silicide (CoSi), tantalum silicide (TaSi), palladium silicide (PdSi), and platinum silicide (PtSi). A silicon nitride film 70 is deposited on the silicide film 60. A BSG film 80 is deposited on the silicon nitride film 70. The BSG film 80 is patterned into a gate electrode pattern using a photolithography technique.

The silicon nitride film 70, the silicide film 60, the control gate 50, the ONO film 40, and the floating gate 30 are sequentially etched by RIE, using the patterned BSG film 80 as a hard mask. When the silicon nitride film 70 is etched by RIE using a gas containing CF in this etching process, a CF deposit is generated. When the control gate 50 is etched by RIE using a gas containing Br, an $SiO_2$ deposit is generated. When the ONO film 40 is etched by RIE using a gas containing CF, a CF deposit is generated. When the floating gate 30 is etched by RIE using a gas containing Br, an $SiO_2$ deposit is generated. As a result, an etching residue 90 is formed as a lamination on the sidewall of the gate structure as shown in FIG. 2.

In order to remove the etching residue 90 formed as the lamination film, the gate structure shown in FIG. 2 is immersed into the etching solution shown in FIG. 1. Because the etching solution 5 according to the present embodiment contains hydrofluoric acid, the $SiO_2$ deposit is etched. The etching solution 5 contains sulfuric acid as a main component, and contains water by only 2 wt % to 4 wt %. Therefore, this etching solution 5 etches the $SiO_2$ deposit while suppressing the etching of the tunnel gate insulation film 20 formed by a thermal oxide film or the ONO film 40 containing the thermal oxide film. Because the etching solution 5 contains sulfuric acid and ozone, a CF deposit can be oxidized, and this can be etched. In this way, the etching solution 5 can selectively remove the $SiO_2$ deposit and the CF deposit in the same process while suppressing the etching of the thermal oxide film.

Figure 3:
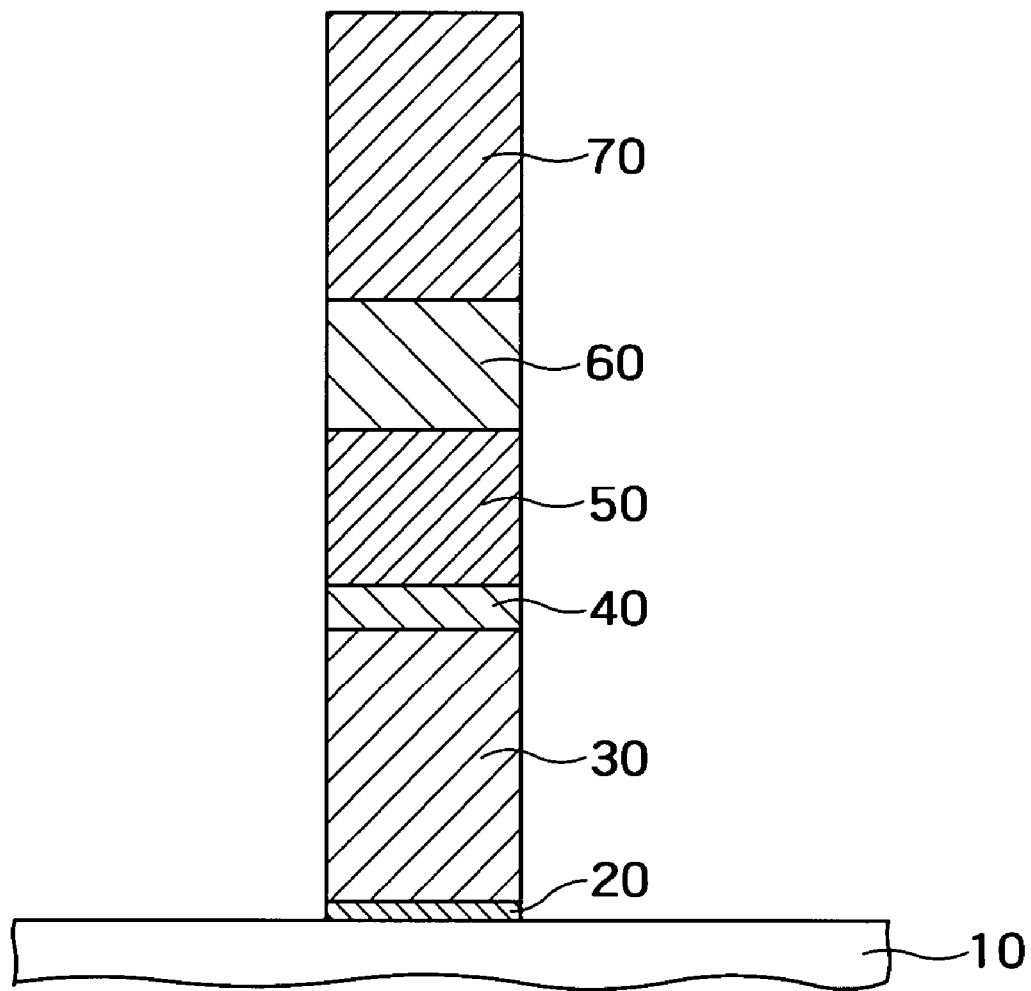
FIG. 3 shows a gate structure free from the etching residue 90 and the BSG film 80.

Further, because the BSG film 80 used as the hard mask is also an $SiO_2$ deposit, the etching solution 5 can also remove the BSG film 80 in the same process. As a result, a gate structure free from the etching residue 90 and the BSG film 80 can be obtained as shown in FIG. 3.

The etching solution 5 according to the present embodiment has sulfuric acid ($H_2SO_4$) as a main component. However, peroxosulfuric acid is considered to be generated due to the dissolving of ozone. Even when a part of usual sulfuric acid is peroxosulfuric acid, the effect of the present embodiment is not lost.

Figure 4:
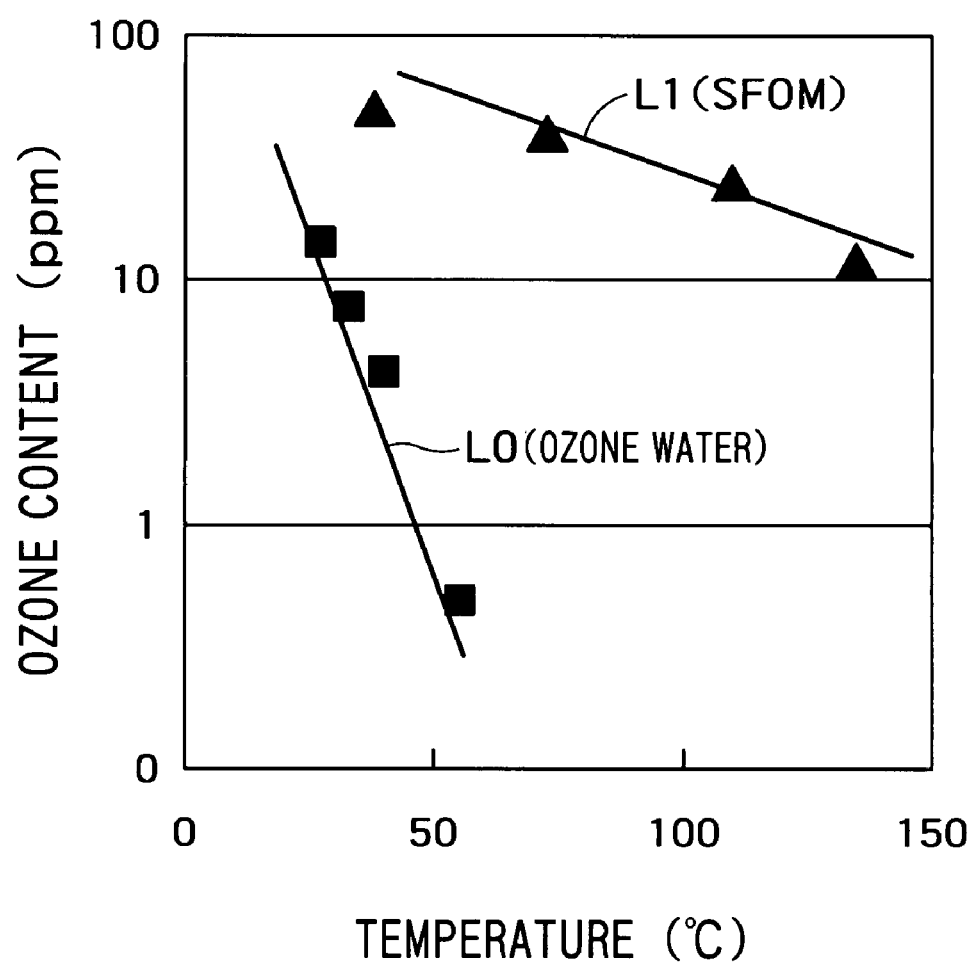
FIG. 4 is a graph showing a relationship between an ozone content of the etching solution 5 according to the present embodiment and a temperature of this liquid.

FIG. 4 is a graph showing a relationship between an ozone content of the etching solution 5 according to the present embodiment and a temperature of this liquid. For comparison, a relationship between ozone content of ozone water and a temperature of this liquid is also shown. A line L0 shows ozone content of conventional ozone water, and a line L1 shows ozone content of the etching solution 5. Both lines show saturation solubility at normal pressure. Ozone water is a liquid having ozone dissolved in pure water.

It can be understood from the line L0 that, in order to dissolve a large amount of ozone into pure water, the temperature of the pure water must be maintained at a low level. For example, when a liquid temperature is about 55° C., an ozone content rate in the pure water is only 0.5 ppm. The etching solution containing only such a small amount of ozone cannot effectively oxidize the CF deposit. Therefore, in order to dissolve a large amount of ozone into the etching solution containing water as a main component or containing much water, the etching solution needs to be kept at a low temperature. For example, in order to maintain the ozone content rate at or above 10 ppm, the liquid temperature needs to be set to about 30° C. or below. However, keeping the etching solution at a low temperature lowers the etching rate.

On the other hand, it can be understood from the line L1 that the etching solution 5 (SOFM) according to the present embodiment can maintain a high ozone content (10 ppm or above) over a wide range of temperature (0 to 150° C.). Particularly, when a temperature of the etching solution 5 is within a range from a room temperature (about 20° C.) to 150° C., the etching solution 5 can dissolve more ozone than the etching solution containing much water. For example, when a liquid temperature is 73° C., the ozone content is 40 ppm, and when a liquid temperature is 110° C., the ozone content is 25 ppm. Further, when a liquid temperature is 135° C., the ozone content is 10 ppm or more. Therefore, the etching solution 5 can sufficiently oxidize the CF deposit efficiently while increasing the etching rate of the etching residue 90.

The etching solution 5 (SOFM) can dissolve ozone of about 30 ppm at 55° C., for example. This etching solution 5 etches the thermal oxide film ($SiO_2$) at an etching rate of about one angstrom/minute. The etching solution 5 also etches the BSG (boron concentration=$2*10^{20}$ atoms/$cm^3$) formed by an LP-CVD (Low Pressure-Chemical Vapor Deposition) at an etching rate of about 3,000 angstrom/minute. In other words, a selection rate of the BSG to the thermal oxide film is about 3,000. Therefore, it is understood that the etching solution 5 can selectively etch the BSG film and the like from the thermal oxide film.

Figure 5:
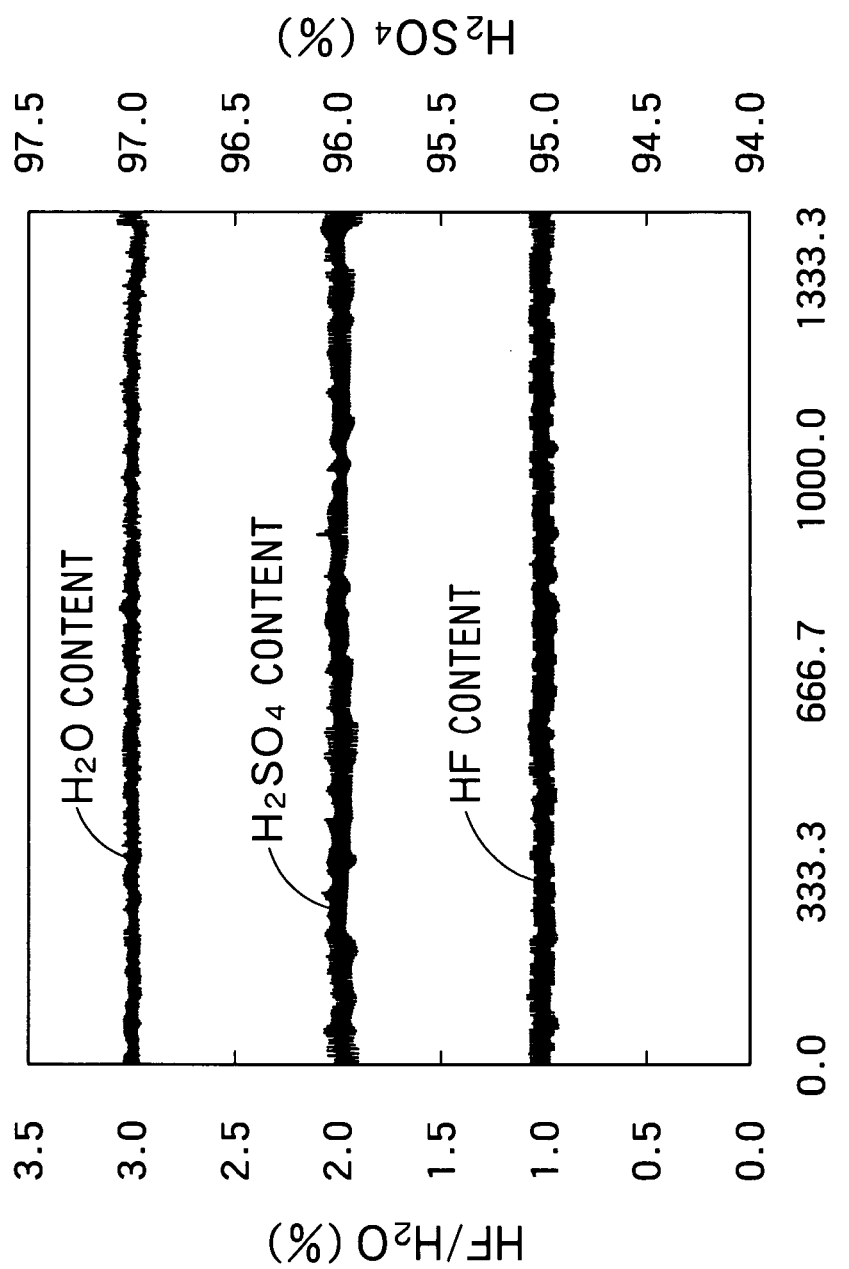
FIG. 5 is a graph showing a relationship between contents of sulfuric acid, hydrofluoric acid, and water and time in the etching process according to the present embodiment.

FIG. 5 is a graph showing a relationship between contents of sulfuric acid, hydrofluoric acid, and water and time in the etching process according to the present embodiment. A temperature of the etching solution is 50° C. In this case, ozone concentration is determined as about 45 ppm, based on the liquid temperature and the saturation solubility. In the actual etching process, concentration of each of sulfuric acid, hydrofluoric acid, water, and ozone is measured with a concentration monitor. In order to keep these concentrations at a constant level, a predetermined chemical is automatically replenished.

The etching solution 5 according to the present embodiment has a high water absorption rate because it contains sulfuric acid as a main content. Therefore, in order to suppress the increase of water content, replenishment of sulfuric acid and hydrofluoric acid becomes necessary. As a chemical for replenishing sulfuric acid, commercially available sulfuric acid containing 98% sulfuric acid and 2% water can be used. As a chemical for replenishing hydrofluoric acid, sulfuric acid/hydrofluoric acid ($HF/H_2SO_4/H_2O=10:88:2$) manufactured by DAIKIN INDUSTRIES, Ltd., for example, can be used. With this arrangement, content of sulfuric acid, hydrofluoric acid, and water can be controlled at constant rates, respectively, as shown in FIG. 5. The content of ozone is determined based on the liquid temperature and the saturation solubility as described above. Therefore, the content of ozone can be maintained constant by itself, by keeping the liquid temperature of the etching solution 5 at a constant level and by exposing the liquid surface of the etching solution 5 in the ozone atmosphere at normal pressure as shown in FIG. 1.

In the present embodiment, the etching process using the etching solution 5 can be a batch type or a wafer-feed type.

The etching process according to the present embodiment can be applied to formation of a gate structure of a NAND flash memory, for example. Consequently, a product generated by etching (deposit) according to the RIE can be removed without giving damage to a tunnel gate oxide film and a shallow trench isolation (STI) oxide film. The etching process according to the present embodiment can be also performed after carrying out a resist ashing such as a dry ashing process.

The invention claimed is:

1. A manufacturing method of a semiconductor device comprising an etching process using an etching solution having ozone dissolved by 10 ppm or more into a liquid containing $H_2SO_4$ by 86 wt % to 97.9 wt %, HF by 0.1 wt % to 10 wt %, and $H_2O$ by 2 wt % to 4 wt %.

2. The manufacturing method of a semiconductor device according to claim 1, wherein the etching solution is used to selectively etch a CF deposit and an $SiO_2$ deposit from a thermal oxide film.

3. The manufacturing method of a semiconductor device according to claim 1, wherein the etching process is executed using the etching solution at 20° C. to 150° C.

4. The manufacturing method of a semiconductor device according to claim 1, wherein the etching solution contains peroxosulfuric acid in a part of $H_2SO_4$.

5. The manufacturing method of a semiconductor device according to claim 1, comprising:
 forming a first gate insulation film on a semiconductor substrate;
 depositing a first gate electrode material on the first gate insulation film;
 depositing a second gate insulation film on the first gate electrode material;
 depositing a second gate electrode material on the second gate insulation film;
 forming a silicide film on the second gate electrode material;
 depositing a protection film on the silicide film;
 depositing a mask material on the protection film;
 forming the mask material into a gate electrode pattern; and
 sequentially etching the protection film, the silicide film, the second gate electrode material, the second gate insulation film, and the first gate electrode material by using the mask material as a mask, thereby forming a first and a second gate electrodes, wherein
 the etching process is executed to remove an etching residue adhered to the sidewall of the protection film, the silicide film, the second gate electrode, the second gate insulation film, and the first gate electrode, respectively.

6. The manufacturing method of a semiconductor device according to claim 2, wherein the etching process is executed using the etching solution at 20° C. to 150° C.

7. The manufacturing method of a semiconductor device according to claim 2, wherein the etching solution contains peroxosulfuric acid in a part of $H_2SO_4$.

8. The manufacturing method of a semiconductor device according to claim 2, wherein the CF deposit is CxFy and CxFyOz (where x, y and z are positive numbers).

9. The manufacturing method of a semiconductor device according to claim 5, comprising:
 the semiconductor device is a NAND-type flash memory device.

* * * * *